United States Patent [19]
Kurihara et al.

[11] Patent Number: 5,587,557
[45] Date of Patent: Dec. 24, 1996

[54] PRINTED CIRCUIT BOARD AND LIQUID CRYSTAL DISPLAY

[75] Inventors: Mikio Kurihara, Yokohama; Satoru Nishi, Zama; Takahiro Onodera, Sagamihara; Kazunari Kushima, Shiga-ken, all of Japan

[73] Assignee: International Business Machines Corporation, Armonk, N.Y.

[21] Appl. No.: 314,992

[22] Filed: Sep. 29, 1994

[30] Foreign Application Priority Data

Sep. 29, 1993 [JP] Japan ................................. 5-242879

[51] Int. Cl.⁶ .................................................. H05K 1/02
[52] U.S. Cl. .......................... 174/266; 174/261; 174/262
[58] Field of Search ............................. 359/84; 174/262, 174/266, 261, 260, 250; 361/760, 761

[56] References Cited

U.S. PATENT DOCUMENTS

| | | | |
|---|---|---|---|
| 5,252,781 | 3/1992 | Shirai et al. ............................. | 174/261 |
| 5,448,451 | 9/1995 | Takubu et al. ............................ | 361/749 |
| 5,453,913 | 9/1995 | Koyanagi ................................ | 361/813 |
| 5,484,965 | 1/1996 | Woychik ................................. | 174/262 |
| 5,489,749 | 2/1996 | DiStefano et al. ....................... | 174/261 |
| 5,491,302 | 2/1996 | DiStefano et al. ....................... | 114/260 |

*Primary Examiner*—Laura Thomas
*Attorney, Agent, or Firm*—Ronald L. Drumheller

[57] ABSTRACT

In a printed circuit board for a liquid crystal display using Tape Automated Bonding (TAB) for making interconnections, flow of molten solder to adjacent input electrodes on the TAB is prevented as well as short-circuiting between electrodes and wire breakage by using an improved TAB structure that avoids applying a concentration of shearing stress to the input electrodes and retards short-circuiting solder flow. This is accomplished by making the width of the slit for the input electrodes uneven. The width of the slit where each of the electrodes crosses over the slit is narrower than elsewhere.

2 Claims, 9 Drawing Sheets

PRINTED CIRCUIT BOARD AND LIQUID CRYSTAL DISPLAY

BACKGROUND OF THE INVENTION

1. Field of the Invention

The invention relates to a film printed circuit board in which long, narrow electrodes, which are provided at a board opening, are laid over the other electrodes, these electrodes being coupled with solder, as well as a liquid crystal display in which liquid crystal cells and wiring boards are connected through a film printed circuit board.

2. Related Art

In liquid crystal displays, a plurality of data lines and gate lines from liquid crystal cells, which are composed of a pair of glass substrates and liquid crystal which is sealed between these glass substrates, are connected with an integrated circuit and on/off switching is controlled by this integrated circuit, thereby displaying images.

An integrated circuit is mounted on a TAB, which is a wiring circuit board for connecting liquid crystal cells and wiring boards. In a TAB, circuit patterns, including integrated circuits, are printed on a film base (for example, polyimide), and the electrodes on the output side of the integrated circuit are connected with the electrodes of said liquid crystal panel body. Moreover, an FPC (Flexible Printed Circuit), etc., can be considered as a wiring circuit board.

In this state, the electrodes on the input side of the integrated circuit and the electrodes of said wiring board are electrically connected by soldering.

As shown in FIG. 7, the electrodes 102 on the input side of the conventional TAB 100 are bridged in long, narrow forms parallel to each other by printing between the opposing lengths of the slit openings 104 (dimension of long side: L; dimension of short side: W) provided on the TAB 100 so that the heat of the soldering iron is sufficiently conveyed. In FIG. 8B, the input electrode 102 is shown only in the opening 104, but in reality, the extended section of the input electrode 102 is printed on the bottom surface of the TAB 100. With the compactness of a liquid crystal display and functional advancement, the precision of the pitch dimension of this input electrode 102 becomes higher. Some with the input electrodes of 0.25 mm in width, and a gap between the input electrodes 102 of about 0.25 mm have already been materialized.

A number of electrodes 108 similar to said input electrodes 102 in shape are arranged opposite the input electrodes 102 on the surface of the wiring board 106. The solder 110 has been applied on these board electrodes 108 in advance.

When the TAB 100 and the wiring board 106 are overlaid in this state, the input electrodes 102 and the basic electrodes 108 are overlaid through the solder 110. When they are heated thereafter, the solder 110 is melted, thereby allowing both the electrodes 102 and 108 to be electrically connected with each other.

However, in the conventional connection (soldering) above, the pitch between the input electrodes 102 was very narrow (0.25 mm) and the melted solder 110 flowed to the adjacent input electrodes 102 (the direction shown by the arrow F in FIG. 8) through the gap (equivalent to the thickness of the board electrode 108) between the periphery of the opening 104 and the wiring board 106 by capillary action, resulting in short-circuiting of the electrodes in some cases (See FIG. 8). Moreover, in FIG. 8A, the flow state of the solder 110 is painted over black for explanation, but this cannot be seen in reality because these portions are located between the TAB 100 and the wiring board 106.

In addition, when an external force is generated such that the TAB 100 and the wiring board 106 move relatively in the direction shown by the arrow A in FIG. 7, the shearing stress is concentrated at the joint portion of the input electrode 102 at the opening 104, as shown in FIG. 9. Breaking of wire may occur at the joint section of this input electrode 102 at the opening section 104.

It is difficult to repair these defects. Because of this, short-circuiting or wire breakage at this soldered section was the biggest factor in increasing the percent defective at companies. Therefore, the lowering of this defect percentage will improve yield and be a most important subject in reducing the loss of profit, but the measures for it have not yet been obtained.

SUMMARY OF THE INVENTION

The object of the invention is to obtain a printed circuit board and a liquid crystal display in which the above facts are taken into account which can prevent short-circuiting and wire breakage between the electrodes from happening and the performance of a process to prevent the flowing of the molten solder to the adjacent electrodes and avoid concentration of shearing stress which is applied to the electrodes.

A first embodiment of the invention is characterized by a printed circuit board comprising a film base in which an opening is provided, wiring which is printed on said base and pulled out near said opening, and long, narrow electrodes which are connected with said wiring and formed so as to traverse said opening on said base, wherein, for said base around said opening, the base areas on both sides of said long, narrow electrodes are cut relatively deeper than the base area of said long, narrow electrodes.

A second embodiment of the invention is characterized by a liquid crystal display in which liquid crystal display cells and wiring boards are connected through a film printed circuit board, wherein said printed circuit board comprises a film base in which an opening is provided, wiring which is printed on said base and pulled out near said opening, and long, narrow electrodes which are formed so as to traverse said opening on said base, wherein, for said base around said opening, the base areas on both sides of said long, narrow electrodes are cut relatively deeper than the base area of said long, narrow electrodes, and wherein the electrodes of said wiring boards and said long, narrow electrodes are connected with solder.

According to the first embodiment of the invention, in cases where long, narrow electrodes and wiring, which is printed on a base, are soldered, since the base areas on both sides of the long, narrow electrodes around an opening are cut deeper than the base area at the lower sections of said long, narrow electrodes, for example, when the long, narrow electrodes are connected with the other electrodes using solder, short-circuiting between the adjacent long, narrow electrodes can be prevented from happening because the flow path of the molten solder to the adjacent long, narrow electrodes becomes long (non-linear).

According to the second embodiment of the invention, when a liquid crystal display is produced using a printed circuit board in accordance with the first embodiment, short-circuiting between the long, narrow electrodes can be prevented from happening because the flow path of solder which connects a long, narrow electrode and a board electrode becomes longer. In addition, since the periphery of the opening becomes uneven due to cutting and the long, narrow electrodes project from the convex portions to the opening, for example, in cases where the liquid crystal display cells and the wiring boards move relatively by an external force, the concentration of shearing stress and bending stress to the joint section of the electrode is eased and wire breakage of this long, narrow electrode can be prevented from happening because this extended portion of the board becomes flexible and capable of elastic deformation.

DESCRIPTION OF THE PREFERRED EMBODIMENTS

Figure 1:
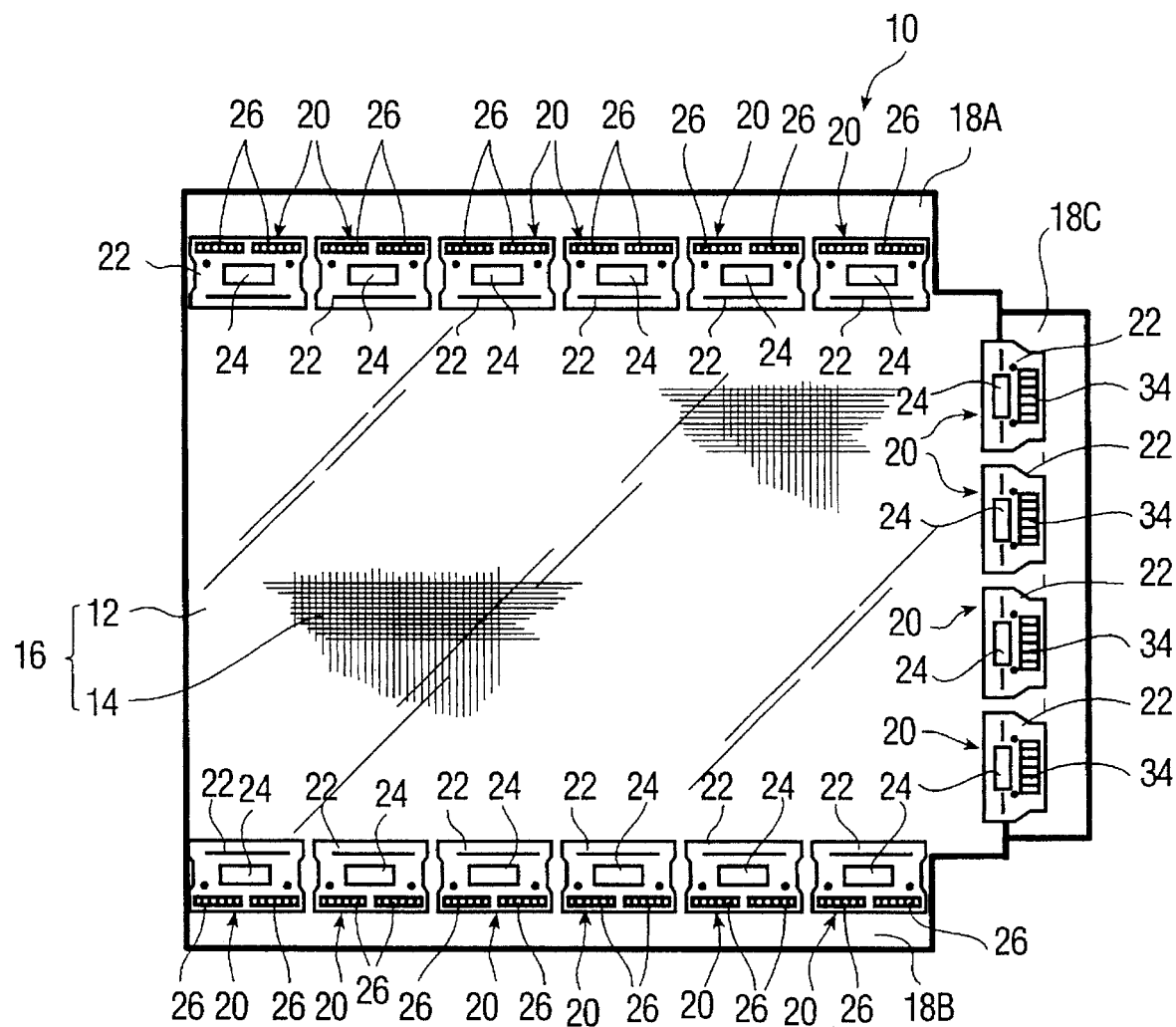
FIG. 1 is a plan view of a liquid crystal display showing the embodiment in which the invention is applied.

FIGS. 1 and 2 show the liquid crystal display 10 relating to the embodiment.

This liquid crystal display 10 is designed to display dot pattern images on the liquid crystal cells 16 which are composed of a pair of transparent glass substrates 12 and the liquid crystals 14 which are sealed between these transparent glass substrates 12.

The X upper board 18A and the X lower board 18B are arranged at both upper and lower sides of the liquid crystal cells 16. Moreover, the Y board 18C is arranged at the right side of these liquid crystal cells 16 in FIG. 1. (These boards are hereafter called merely boards 18A to C as the necessity requires.) These boards 18A to C have a role in outputting a signal for controlling switching (conduction, non-conduction) of the liquid crystals in sub-pixel units in the liquid crystal cells 16 in response to a signal from an input device not illustrated in the figure.

Figure 3:
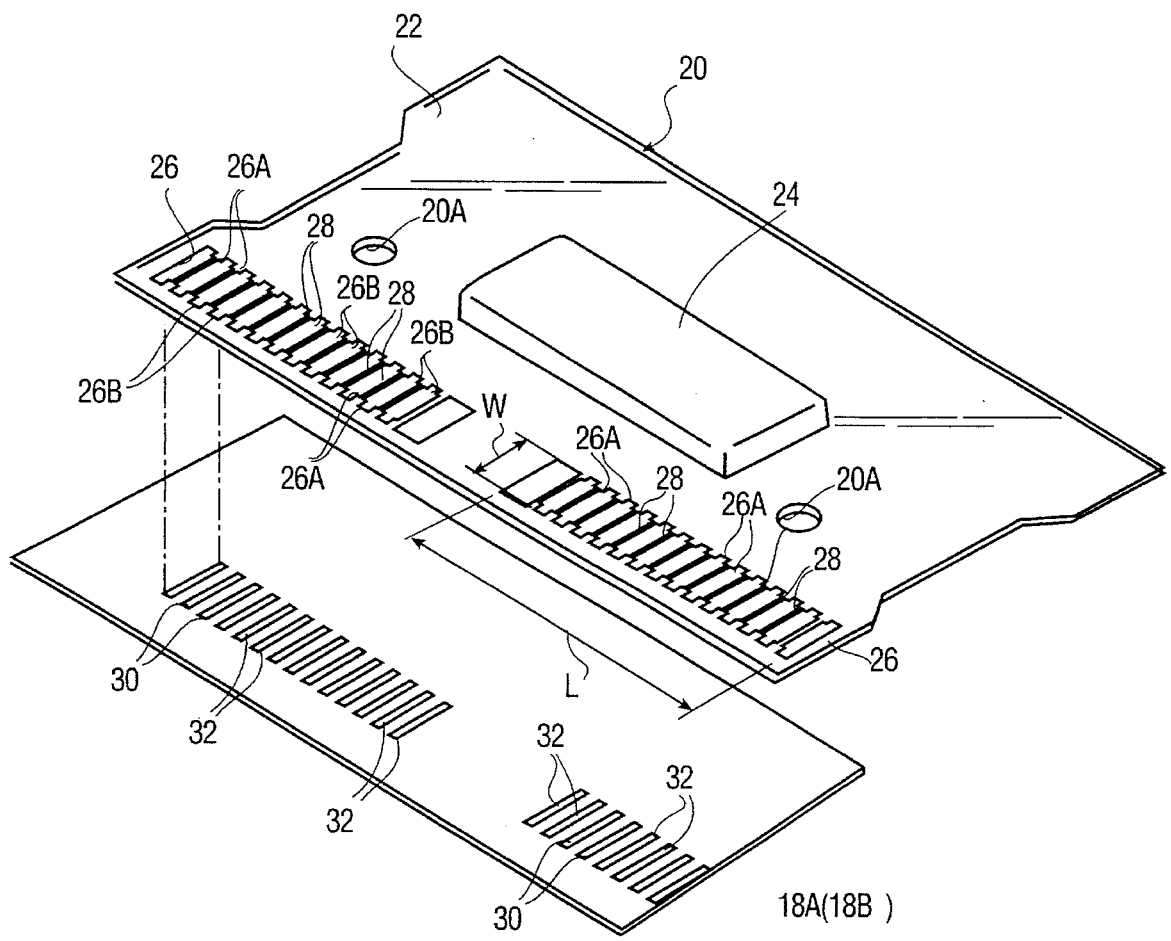
FIG. 3 is an exploded perspective view illustrating the coupling state of TAB and board relating to the embodiment.
Figure 4:
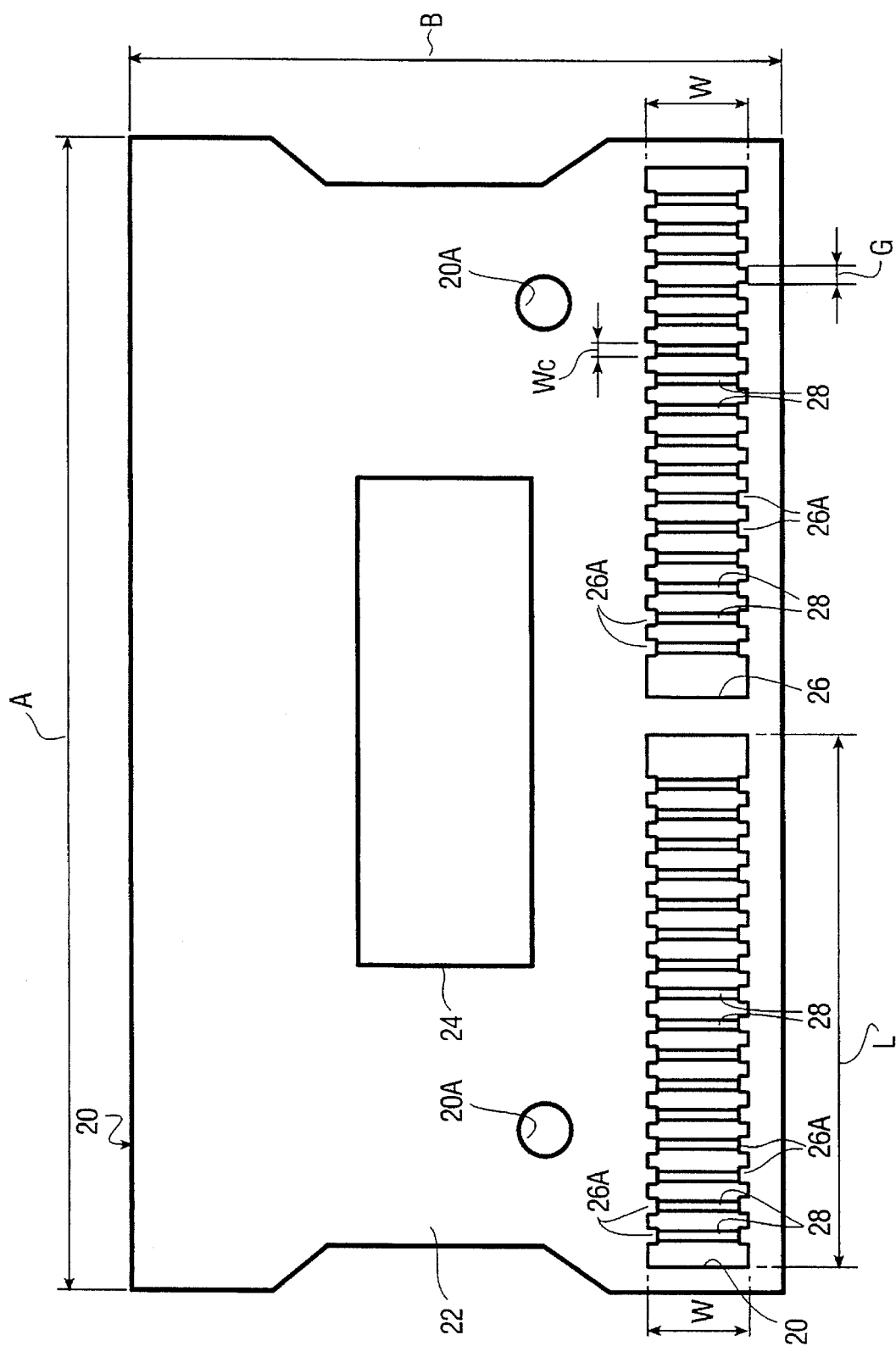
FIG. 4 is an enlarged plan view illustrating TAB relating to the embodiment.

The boards 18A to C and the liquid crystal cells 16 are connected by the TAB 20 shown in FIGS. 3 and 4. TAB is an abbreviation of Tape Automated Bonding. The constitution of the TAB 20 is that a wiring pattern is printed on the thin-film base 22 (as shown in FIG. 4, for example, external dimension: A×B=28.19×16.54 mm) which is formed of polyamide. The integrated circuit 24 for directly controlling switching (conduction, non-conduction) of liquid crystals in sub-pixel units in response to the signal from said boards 18A to C is mounted at the center. The TAB 20 is so arranged that each terminal of this integrated circuit 24 and the wiring patterns (illustration omitted) on the sides of the liquid crystal cells 16 and the boards 18A to C, respectively, are printed and mounted on the side of the liquid crystal cells 16 in advance. The connection with the boards 18A to C (including electrical connection) can then be made by the process carried out thereafter.

As shown in FIGS. 3 and 4, on the TAB 20 for the X upper board 18A and the X lower board 18B, slits 26 (dimension of long side: L, dimension of short side: W), which are rectangular through holes, are provided opposite these boards 18A and B. The dimension of the short side of this slit 26, that is, the width (W) of the slit, is, for example, 2 mm and the terminal sections (hereafter called input electrodes 28) of the pattern to be wired from said integrated circuit 24 are exposed and placed parallel to each other so that they traverse the space between the lengths of the slit 26. The gap G between these input electrodes 28 is, for example, 0.25 mm, and the adjacent input electrodes 28 are precisely arranged so as not to come into contact with each other.

For the internal circumference of the lengths of said slit 26 for said input electrodes 28, the width dimension Wc is substantially narrowed since the convex sections 26A, which project beyond the width dimension Wc along the longitudinal direction of the input electrode 28, are provided for the end section of each input electrode 28 in the longitudinal direction, respectively, at a width almost the same as the width dimension Wc (0.25 mm) of this input electrode 28. It can also be said that the width dimension W is substantially expanded since these convex sections 26A are made in the notch section 26B in which the end face of the TAB 20 is cut in rectangular form. In this way, the internal circumference of the lengths of the slit 26 are made uneven.

The board electrodes 30 (See FIG. 3) are provided on the boards 18A and B at positions corresponding to the input electrodes 28 exposed in this slit 26. As shown in FIG. 2B, the dimensions of the board electrode 30 are made almost the same as those of the input electrode 28. The number of board electrodes 30 is equal to that of said input electrodes 28. The boards A and B and TAB 20 are electrically connected by laying the input electrodes 28 and the board electrodes 30 over one another.

Moreover, the positioning of the TAB 20 and the boards 18A to C is carried out by inserting positioning pins (not illustrated), which are provided on the boards 18A to C, into a pair of circular holes 20A, which are provided on the TAB 20.

The solder 32 is applied on the board electrodes 30 in advance. It is arranged so that, when said input electrodes 28 and board electrodes 30 are overlaid, the solder is pinched between these electrodes 28 and 30. When these are heated in this state, the solder 32 is melted, and thereby able to secure the electrodes 28 and 30. This melted solder 32 flows along said convex section 26A.

Figure 2A:
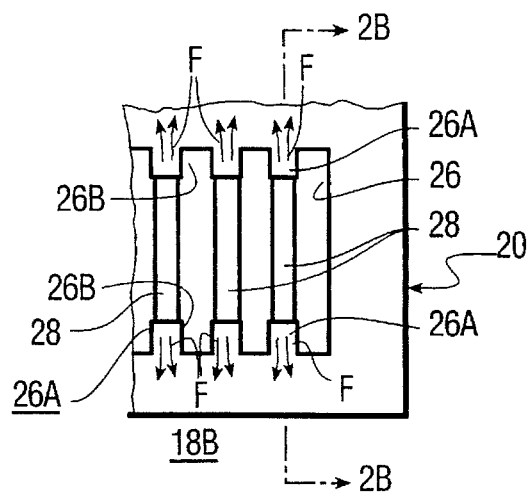
FIG. 2A is an enlarged plan view illustrating the vicinity of the slit which is formed on the TAB on the X board side relating to the embodiment.
Figure 2B:
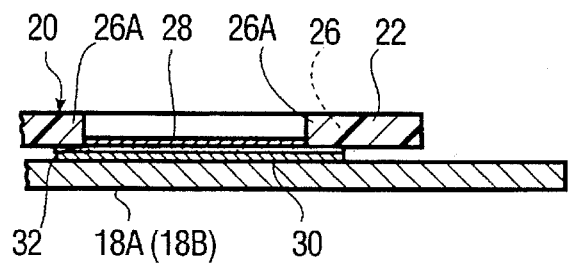
FIG. 2B is a IIB—IIB sectional view.
Figure 2C:
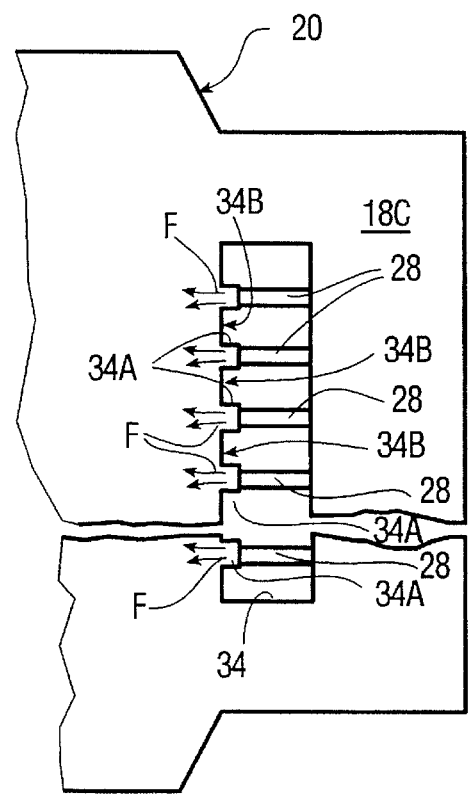
FIG. 2C is an enlarged plan view illustrating the vicinity of the slit which is formed on the TAB on the Y board side.

On the other hand, the rectangular slit 34 is formed on the TAB 20 for the Y board 18C, as shown in FIG. 2C. The input electrodes 28, which are the end sections of the pattern wired from said integrated circuit 24 are exposed, extended parallel to each other, and bridged so as to traverse the space between the lengths of the slit 34. The gap G between these input electrodes 28 is 0.25 mm and the adjacent input electrodes 28 are precisely arranged so as not to come into contact with each other.

For the length of the liquid crystal cells 16 of the slit 34 corresponding to the input electrodes 28 of the TAB 20 corresponding to this Y board 18C, the end face, which projects a little along the longitudinal direction of the input electrodes 28 and/or does not come in contact with the input electrodes of the TAB 20, is unevenly cut (convex section 34A, concave section 34B) in rectangular form at a width almost the same as the width dimension of the input electrodes 28. That is, to obtain this uneven shape, either the convex section 34A or the concave section 34B needs to be formed at least.

In this way, in the Y board 18C, the solder 32, which is applied to the board electrode 30 in advance, is applied one-sidedly to the length on the side of the liquid crystal cells 16 of said slit 34 so that the melted solder 32 flows to the convex section 34A side.

The effects of the embodiment will be described below.

In cases where the boards 18A and B and the liquid crystal cells 16, to which the TAB 20 is attached, are connected, the board electrodes 30 and the input electrodes 28 which are exposed from the slit 26 of the TAB 20 are overlaid opposite each other since the solder 32 is applied on the board electrodes 30 of the boards 18A and B in advance.

When both electrodes are heated thereafter, the solder 32 is melted out. Moreover, the electrodes are in general compressed in addition to heating, but it can also be arranged so that only heat is applied to the electrodes using laser beam, etc.

The solder 32 is melted and is thereafter hardened, thereby allowing both electrodes, the TAB 20, and the boards 18A and B, to be connected.

In the conventional connection structure using the solder 32, the base 22 of the TAB 20 of the adjacent input electrodes 28 was made in a straight line. Therefore, the input electrodes 28 were short-circuited in some cases because the melted solder 32 flowed in the shortest distance to the adjacent input electrodes 28 due to the capillary action which took place at the gap between this base 22 and the boards 18A and B.

In this embodiment however, since the convex sections 26A are formed on the long side of the slit 26 so as to make the long side uneven and the base 22 of the TAB 20 of the adjacent input electrodes 28 non-linear, the flow path of the solder 32 along the direction shown by the arrow F in FIG. 2A is extended. Therefore, the melted solder 32 will not flow to the adjacent input electrodes 28, thus preventing short-circuiting from occurring.

Figure 5:
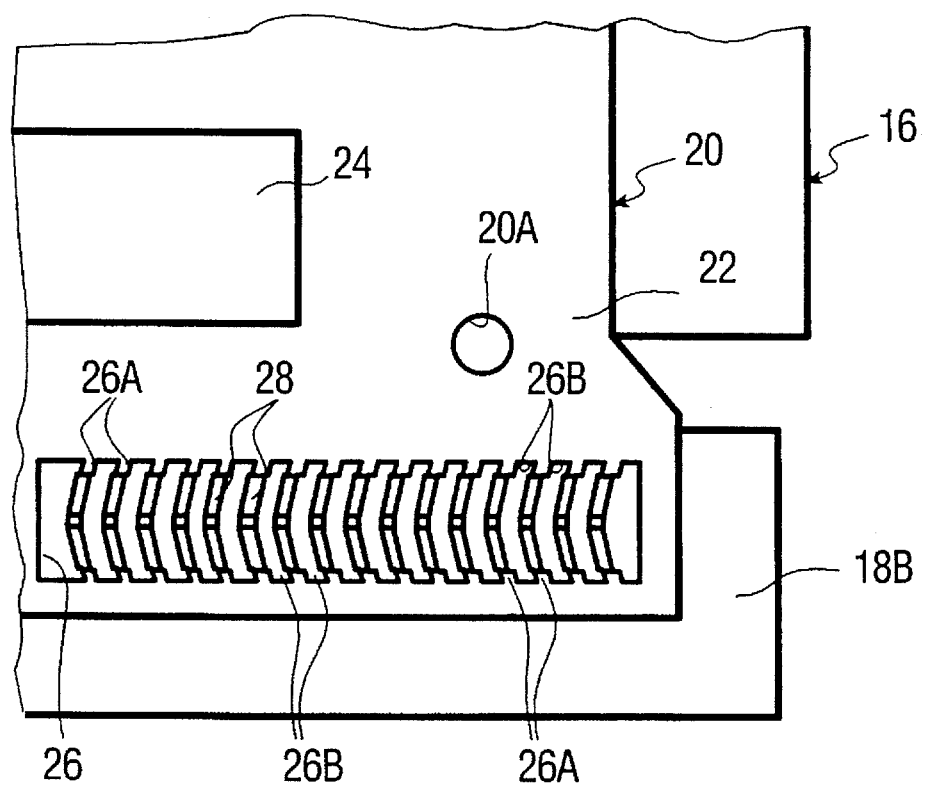
FIG. 5 is a partial enlarged view of FIG. 4 illustrating the deformation state of the TAB during relative motion of the liquid crystal cells and board.

Moreover, since it is arranged so that the input electrodes 28 project from the convex sections 26A of the long side 26, and so that in cases of a relative motion occurrence between the TAB 20 and the boards 18A and B by an external force, concentration of stress of the input electrodes 28 to the end sections of the slit 26 can be avoided and wire breakage can be restricted because the convex sections 26A are deformed separately, as shown in FIG. 5, thus increasing the deformation tolerance of the TAB 20.

On the other hand, as shown in FIG. 2C, the flowing of the melted solder 32 to the adjacent input electrodes 28 can be avoided and concentration of stress can be restricted because it is arranged so that, in the connection of the Y board 18 and the TAB 20, length on the liquid crystal cells 16 side of the slit 34 is also made uneven (convex sections 34A, concave sections 34B) similar to the above, and the input electrodes 28 are exposed from the convex sections 34A.

In this way, in this embodiment, the length (or bottom side) for corresponding to the projected ends of the input electrodes 28 of the slit 26 (or slit 34), in which the input electrodes 28 are exposed, is made uneven, thereby extending the flow path of the melted solder 32 and preventing short-circuits. Moreover, the concentration of stress to the input electrodes 28 can be eased by this unevenness and the strength can be increased at the time of a relative motion occurrence (deformation) of the TAB 20 and the boards 18A to C due to external force.

Therefore, the short-circuit and wire breakage, which were the biggest factors of the defect percentage, can be markedly reduced, thereby greatly improving yield and reducing the loss of profit.

Figure 6:
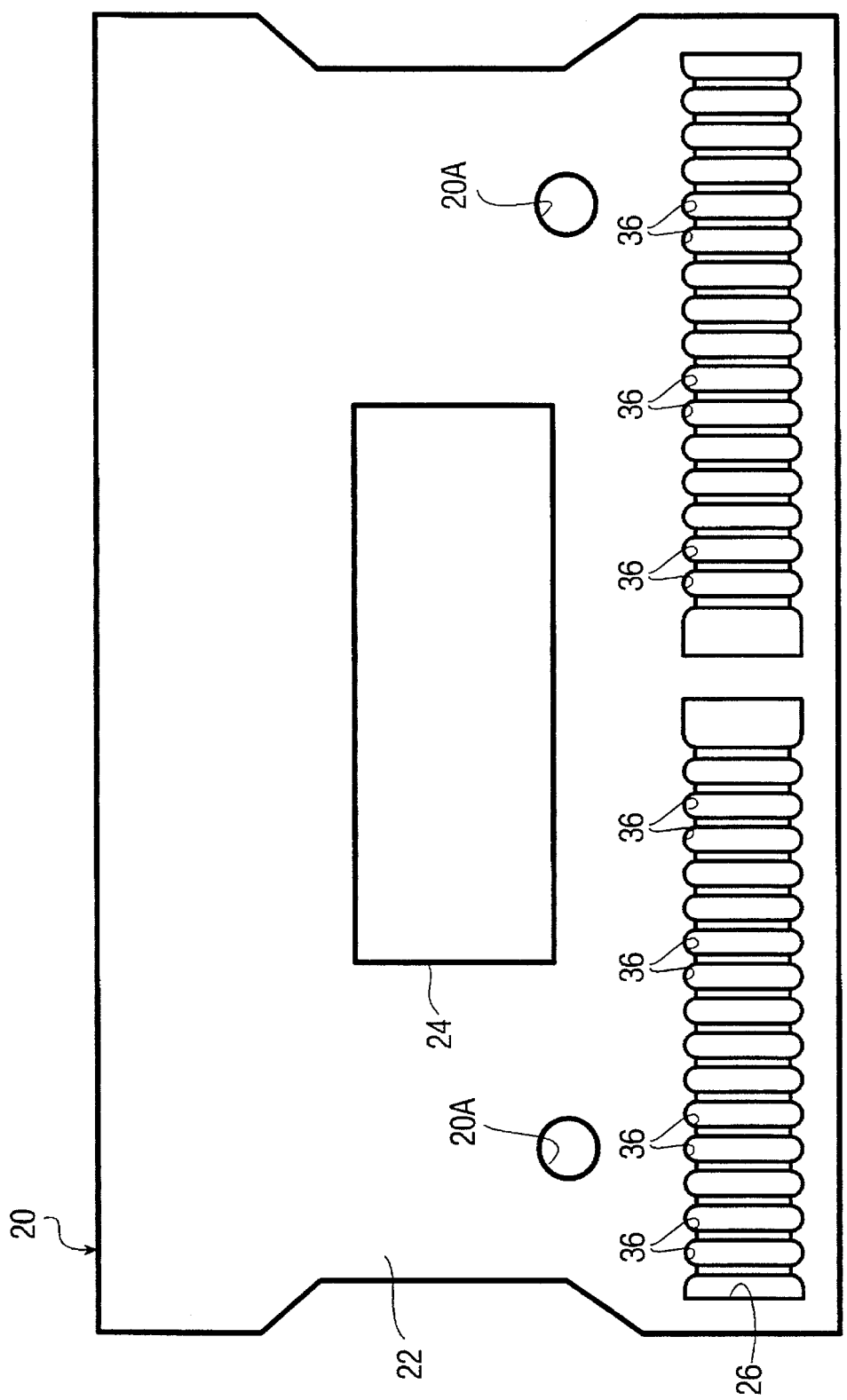
FIG. 6 is an enlarged plan view illustrating the deformation of the TAB.
Figure 7:
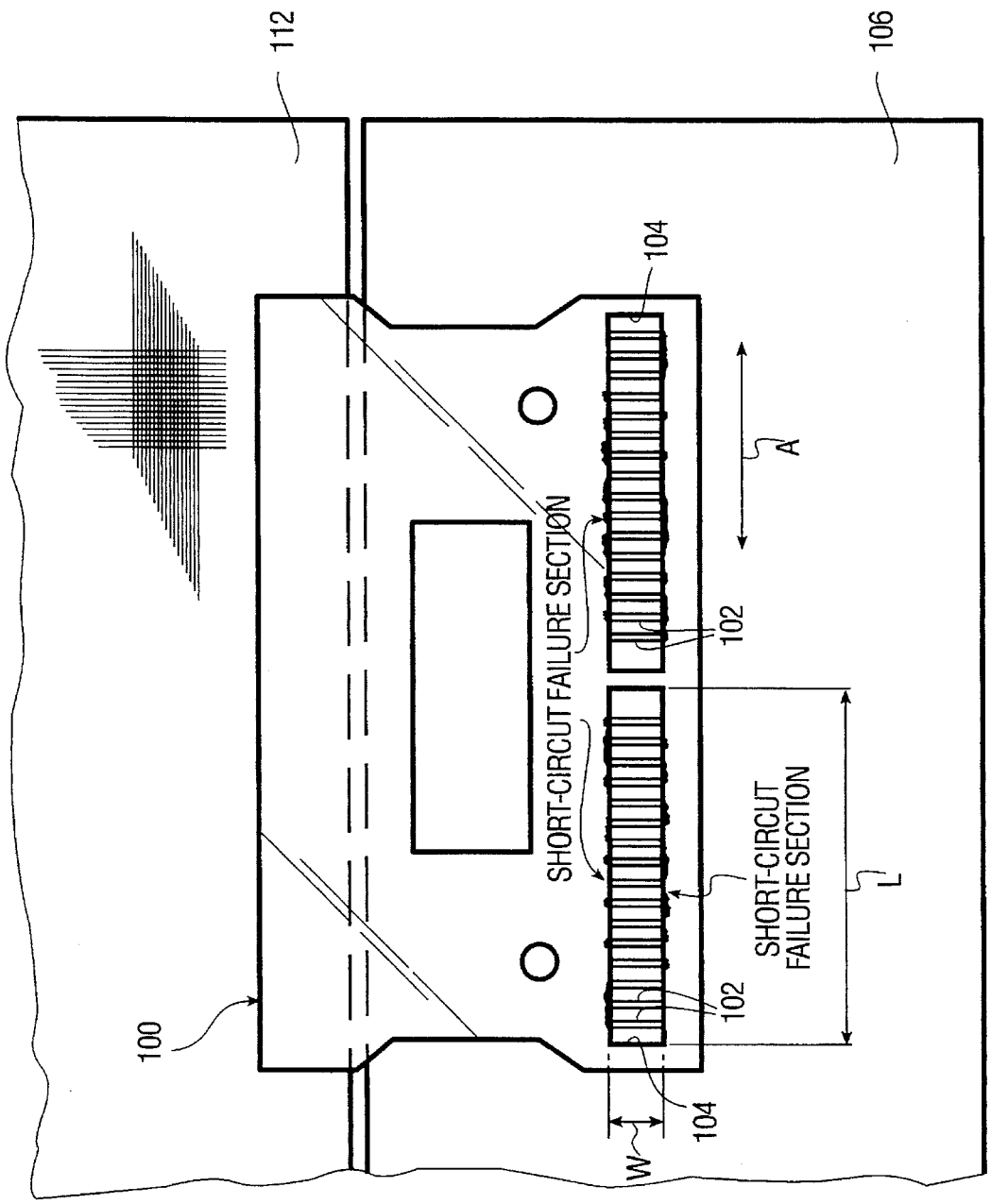
FIG. 7 is a plan view illustrating the vicinity of the conventional TAB.
Figure 8A:
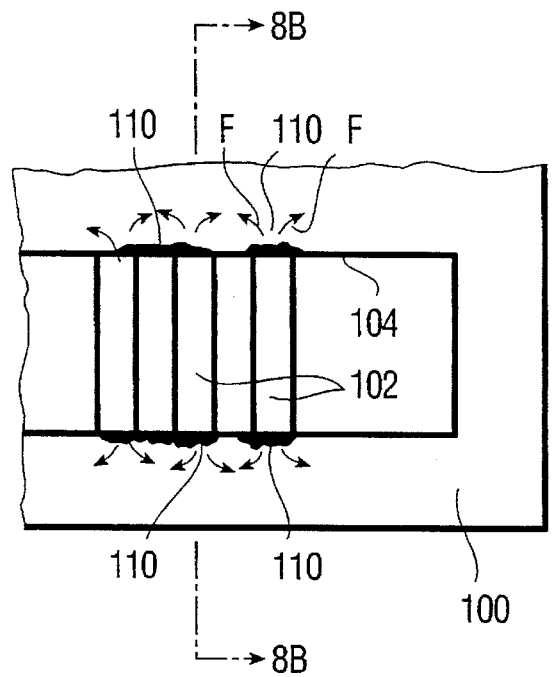
FIG. 8A is an enlarged plan view illustrating the vicinity of the opening of the conventional TAB.
Figure 8B:
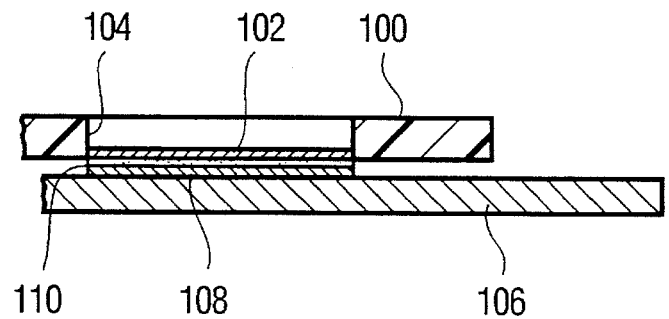
FIG. 8B is a VIIIB—VIIIB sectional view illustrating the vicinity of the opening.
Figure 9:
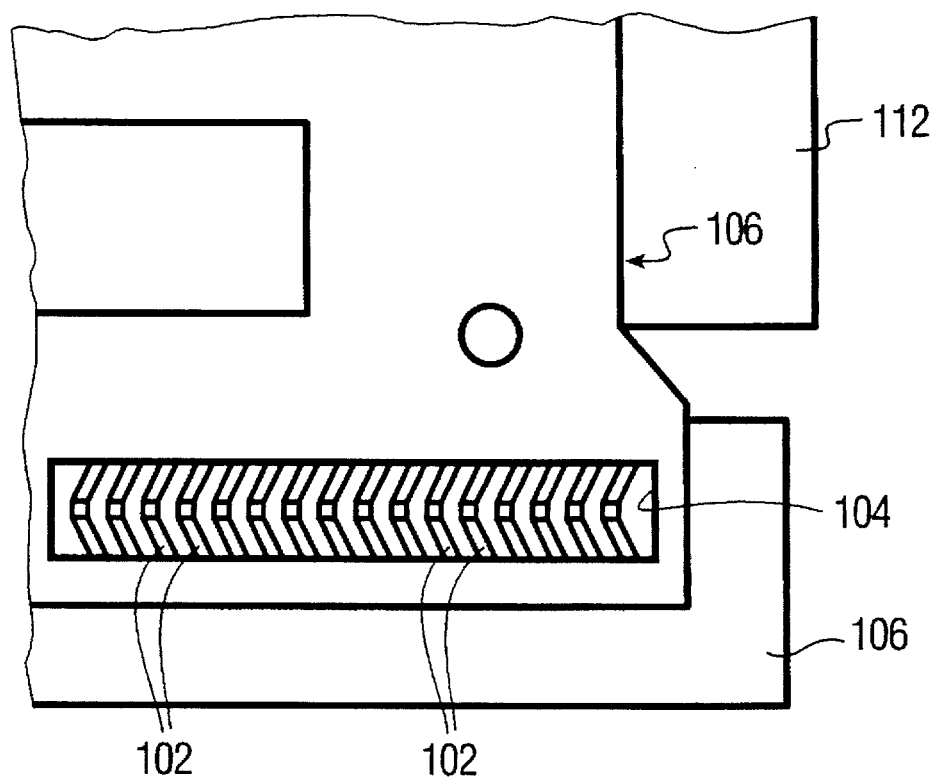
FIG. 9 is a partial enlarged view of FIG. 8A illustrating the wire breakage state of input electrodes in the conventional TAB.

Moreover, in this embodiment, unevenness is rectangularly formed in the slits 26 and in the slits 34. But as shown in FIG. 6, the sections which do not correspond to the input electrodes can be made in circularly concave form so as to form the concave sections 36, thus making the base 22 of the TAB 20 between the adjacent input electrodes non-linear. Furthermore, to make the base 22 of the TAB 20 between the adjacent input electrodes non-linear, various forms, such as making the concave sections 26B triangular, can be applied.

As stated above, a printed circuit board and a liquid crystal display related to the invention have an excellent effect in preventing short-circuiting between the electrodes as well as wire breakage since a process to prevent the flow of the molten solder to the adjacent input electrodes and to avoid the concentration of shearing stress on the input electrodes has been applied to them.

We claim:

1. An improved Tape Automated Bonding (TAB) structure for contacting a printed circuit board, said TAB structure comprising:

a film base in which an opening is provided;

wiring which is printed on said film base and extending near said opening; and long, narrow electrodes which are connected with said wiring and formed so as to traverse said opening in said film base, wherein said opening in said film base on either sides of said long, narrow electrodes is wider than at said long, narrow electrodes.

2. A liquid crystal display in which liquid crystal display cells and wiring boards are connected through a film printed circuit board, wherein said film printed circuit board comprises a film base in which an opening is provided, wiring which is printed on said film base and extending near said opening, and long, narrow electrodes which are formed so as to traverse said opening in said film base, wherein said opening in said film base on either sides of said long, narrow electrodes is wider than at said long, narrow electrodes, and wherein the electrodes of said wiring boards and said long, narrow electrodes are connected with solder.

* * * * *